(12) United States Patent
Pueschner et al.

(10) Patent No.: US 10,395,157 B2
(45) Date of Patent: Aug. 27, 2019

(54) SMART CARD MODULE ARRANGEMENT, SMART CARD, METHOD FOR PRODUCING A SMART CARD MODULE ARRANGEMENT AND METHOD FOR PRODUCING A SMART CARD

(71) Applicant: Infineon Technologies AG, Neubiberg (DE)

(72) Inventors: Frank Pueschner, Kelheim (DE); Thomas Spoettl, Mintraching (DE); Jens Pohl, Bernhardswald (DE); Peter Stampka, Burglengenfeld (DE)

(73) Assignee: Infineon Technologies AG, Neubiberg (DE)

( * ) Notice: Subject to any disclaimer, the term of this patent is extended or adjusted under 35 U.S.C. 154(b) by 190 days.

(21) Appl. No.: 14/483,174

(22) Filed: Sep. 11, 2014

(65) Prior Publication Data
US 2015/0069132 A1    Mar. 12, 2015

(30) Foreign Application Priority Data
Sep. 11, 2013   (DE) ................. 10 2013 109 976

(51) Int. Cl.
*H01L 21/56*   (2006.01)
*G06K 19/077*  (2006.01)
(Continued)

(52) U.S. Cl.
CPC . *G06K 19/07728* (2013.01); *G06K 19/07722* (2013.01); *G06K 19/07747* (2013.01);
(Continued)

(58) Field of Classification Search
CPC ....... H01L 2924/00; H01L 2924/00014; H01L 2224/48091; H01L 2224/48227;
(Continued)

(56) References Cited

U.S. PATENT DOCUMENTS 5,973,600 A    10/1999  Mosher, Jr.
6,435,415 B1 *  8/2002  Catte ................ G06K 19/07749
                                                    235/488
(Continued)

FOREIGN PATENT DOCUMENTS

CN              1493058 A       4/2004
DE    10 2011 056 323 A1         6/2013
(Continued)

OTHER PUBLICATIONS

Office action received for German Patent Application No. 10 2013 109 976.9, dated Feb. 7, 2014, 6 pages of office action (Information Purpose Only).

*Primary Examiner* — Thien M Le
*Assistant Examiner* — Tae W Kim
(74) *Attorney, Agent, or Firm* — Viering, Jentschura & Partner MBB

(57) ABSTRACT

A method for producing a smart card module arrangement includes: arranging a smart card module on a first carrier layer, wherein the first carrier layer is free of a prefabricated smart card module receptacle cutout for receiving the smart card module. The smart card module includes: a substrate; a chip on the substrate; a first mechanical reinforcement structure between the chip and the substrate. The first mechanical reinforcement structure covers at least one part of a surface of the chip. The method further includes applying a second carrier layer to the smart card module, wherein the second carrier layer is free of a prefabricated smart card module receptacle cutout for receiving the smart card module; and at least one of laminating or pressing the first carrier layer with the second carrier layer, such that the smart card module is enclosed by the first carrier layer and the second carrier layer.

20 Claims, 9 Drawing Sheets

(51) Int. Cl.
*H01L 23/00* (2006.01)
*H01L 23/31* (2006.01)

(52) U.S. Cl.
CPC ........ *G06K 19/07775* (2013.01); *H01L 21/56* (2013.01); *H01L 24/83* (2013.01); *H01L 23/3121* (2013.01); *H01L 2224/83201* (2013.01); *H01L 2224/83902* (2013.01); *H01L 2924/06* (2013.01); *H01L 2924/12042* (2013.01); *H01L 2924/141* (2013.01)

(58) Field of Classification Search
CPC ....... H01L 2224/73265; H01L 2224/97; H01L 2924/14; H01L 2224/32225; H01L 2924/00012; H01L 2924/12042; H01L 2924/01047; H01L 2924/18; H01L 2924/01015; H01L 2924/10253; H01L 2924/3025; H01L 2224/48465; H01L 2224/32145; H01L 2224/45147; H01L 2224/85; H01L 2924/12044; H01L 2924/12041; H01L 29/0665; H01L 29/0673; H01L 29/068; H01L 29/78696; H01L 51/0048; H01L 51/0545; G06K 19/07749; G06K 19/077; G06K 19/07743; B82Y 10/00
USPC ........................................................ 235/488
See application file for complete search history.

(56) References Cited

U.S. PATENT DOCUMENTS

| | | | |
|---|---|---|---|
| 2003/0062420 A1* | 4/2003 | Ohta ................ | G06K 19/07728 235/492 |
| 2003/0214794 A1 | 11/2003 | Takahashi et al. | |
| 2004/0099745 A1 | 5/2004 | Haghiri et al. | |
| 2013/0146671 A1* | 6/2013 | Grieshofer ....... | G06K 19/07794 235/492 |

FOREIGN PATENT DOCUMENTS

| | | |
|---|---|---|
| JP | 2000187717 A | 7/2000 |
| JP | 2005004430 A | 1/2005 |
| WO | 2012163658 A1 | 12/2012 |

* cited by examiner

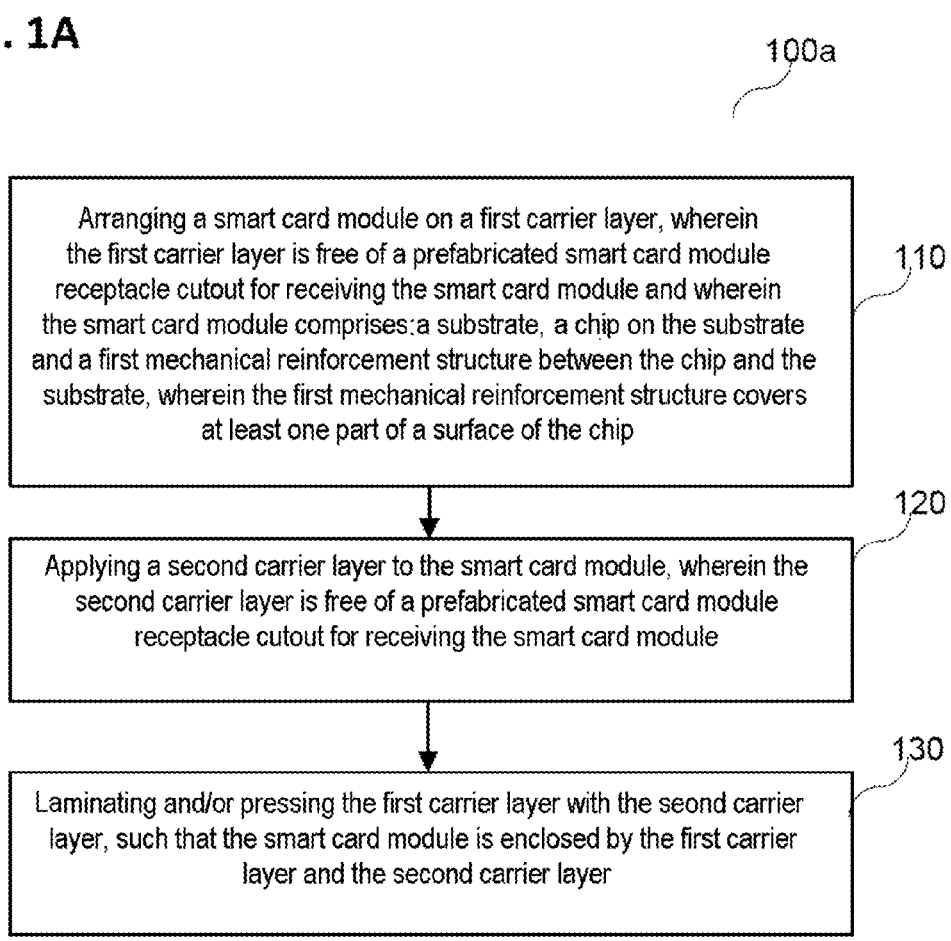

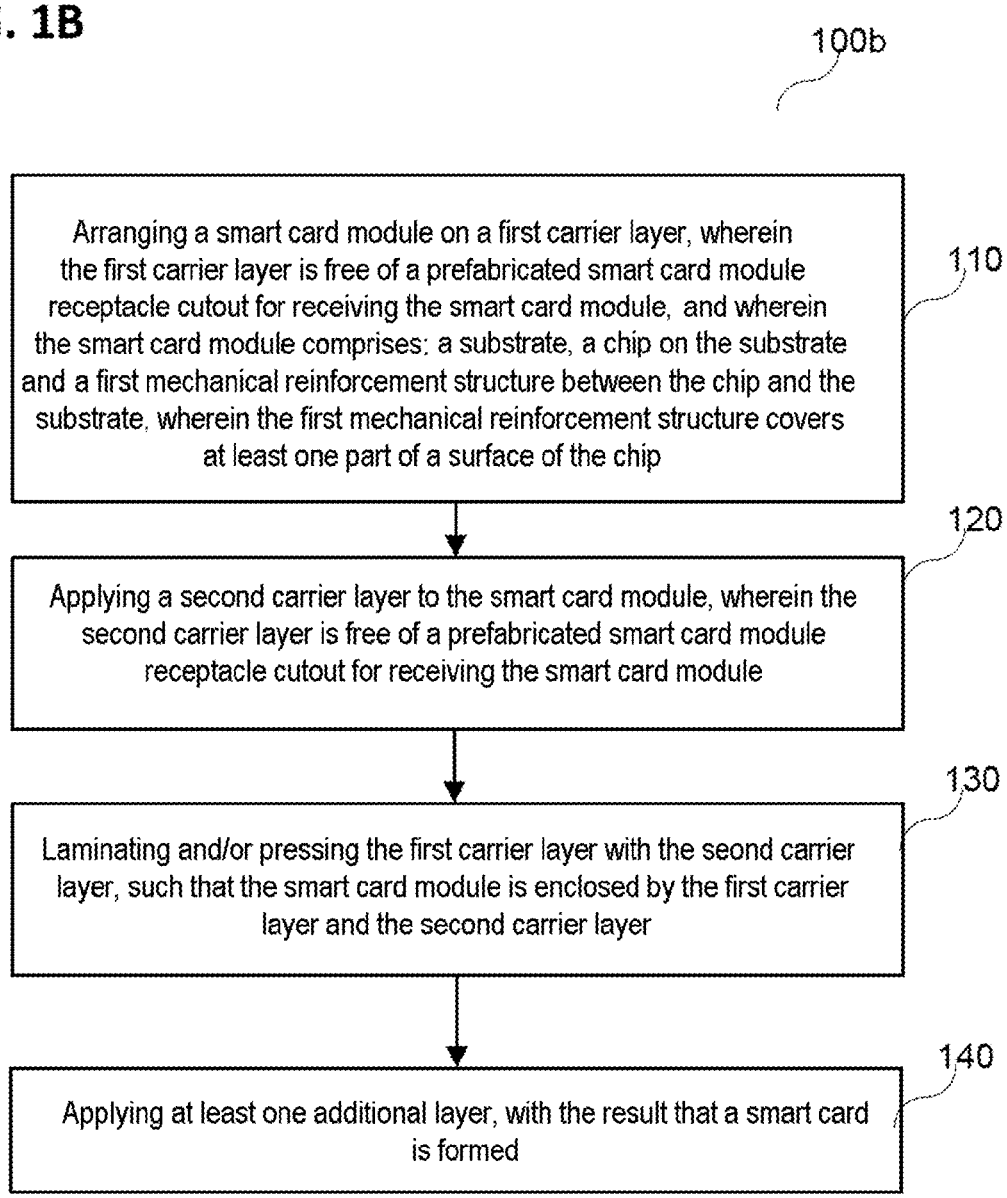

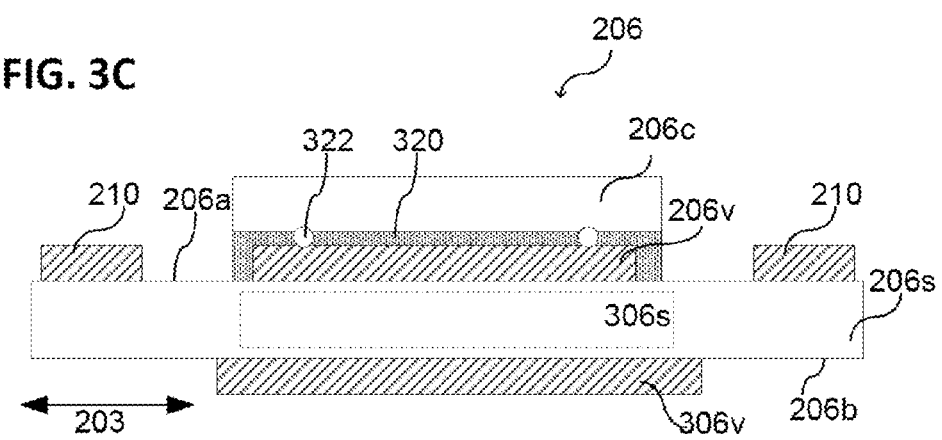
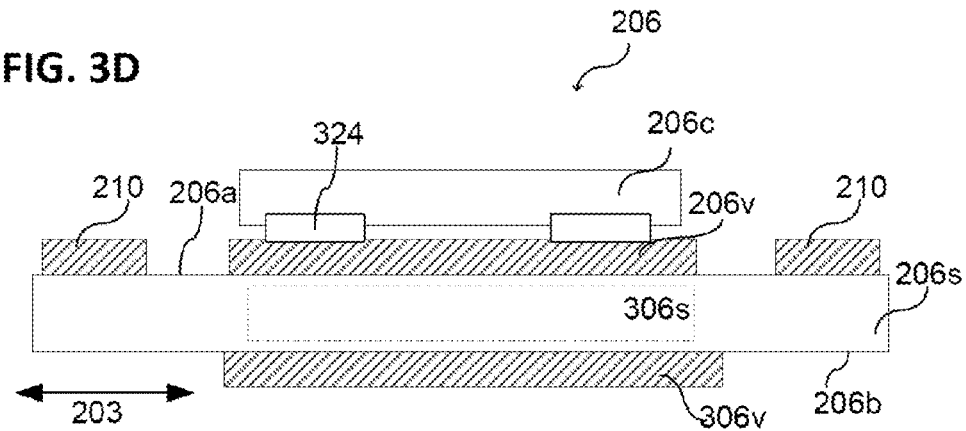

SMART CARD MODULE ARRANGEMENT, SMART CARD, METHOD FOR PRODUCING A SMART CARD MODULE ARRANGEMENT AND METHOD FOR PRODUCING A SMART CARD

CROSS-REFERENCE TO RELATED APPLICATION

This application claims priority to German Patent Application Serial No. 10 2013 109 976.9, which was filed Sep. 11, 2013, and is incorporated herein by reference in its entirety.

TECHNICAL FIELD

Various embodiments relate generally to a smart card module arrangement, a smart card, a method for producing a smart card module arrangement and a method for producing a smart card.

BACKGROUND

In general, many different fields of application arise for smart cards (integrated circuit cards), for example in the field of personal identification (identity cards, access cards, authorization cards), in the field of data encryption (code cards), for personal use (bank smart cards, payment cards) and in similar fields. Aspects during smart card production, in addition to costs, can also include durability, protection against counterfeiting, protection against manipulation, and the functionality sought.

SUMMARY

A method for producing a smart card module arrangement includes: arranging a smart card module on a first carrier layer, wherein the first carrier layer is free of a prefabricated smart card module receptacle cutout for receiving the smart card module. The smart card module includes: a substrate; a chip on the substrate; a first mechanical reinforcement structure between the chip and the substrate. The first mechanical reinforcement structure covers at least one part of a surface of the chip. The method further includes applying a second carrier layer to the smart card module, wherein the second carrier layer is free of a prefabricated smart card module receptacle cutout for receiving the smart card module; and at least one of laminating or pressing the first carrier layer with the second carrier layer, such that the smart card module is enclosed by the first carrier layer and the second carrier layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a schematic flow chart for a method for producing a smart card module arrangement, in accordance with various embodiments;

FIG. 1B shows a schematic flow chart for a method for producing a smart card, in accordance with various embodiments;

FIGS. 3A to 3D show in each case in a schematic side view or cross-sectional view a smart card module, in accordance with various embodiments;

DESCRIPTION

Figure 2A:
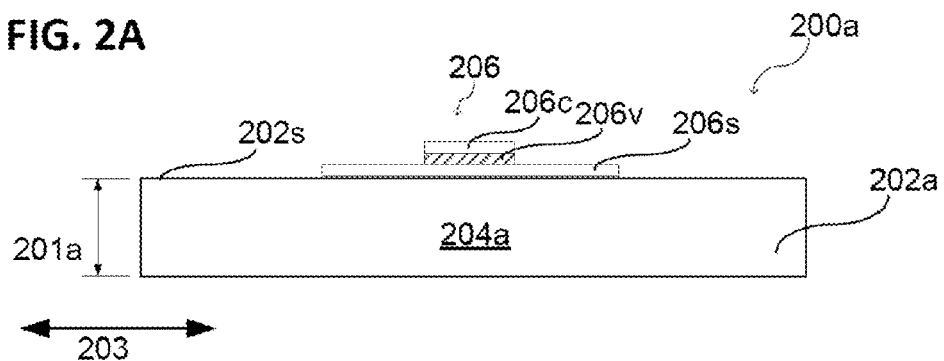
FIGS. 2A and 2B each show a smart card module arrangement during the production in a schematic side view or cross-sectional view, in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration purposes and is not restrictive in any way whatsoever. It goes without saying that other embodiments can be used and structural or logical amendments can be made, without departing from the scope of protection of the present invention. It goes without saying that the features of the various exemplary embodiments described herein can be combined with one another, unless specifically indicated otherwise. The following detailed description should therefore not be interpreted in a restrictive sense, and the scope of protection of the present invention is defined by the appended claims.

Furthermore, the figures may contain one or more dotted lines which may be, for example, subsidiary lines for better orientation and/or may illustrate regions, for example.

In the context of this description, the terms "connected" and "coupled" are used to describe both a direct and an indirect connection, and a direct or indirect coupling. In the figures, identical or similar elements are provided with identical reference signs, insofar as is expedient.

The term "flexible" used herein in the sense of a "flexible" structure may be understood, for example, such that said structure reacts to a mechanical loading with a deformation, without the structure being damaged in the process, wherein the deformation can be reversible, for example, or the structure deforms plastically or elastically. In this regard, the term stiffness can be understood as the resistance of a structure (for example of a smart card module) to a mechanical deformation, e.g. on account of a mechanical force or a mechanical stress. The stiffness of a structure may depend, for example, on the material of the structure and the geometry of the structure. The compliance (or flexibility) can thus also be regarded as the reciprocal of the stiffness. A flexible component part or a flexible structure (e.g. a flexible chip, a flexible carrier, a flexible substrate) can accordingly have a low stiffness and a high flexibility.

One aspect of various embodiments can illustratively be seen in providing a smart card including a smart card module, wherein the smart card module of the smart card is embedded between at least two carrier layers, wherein the carrier layers have no prefabricated and/or predefined cutouts for receiving the smart card module. In this case, the smart card module can be embedded (laminated and/or pressed) into the carrier layers in such a way that the carrier layers form the smart card (the smart card housing for the smart card module) or at least partly form a smart card, e.g. a smart card module arrangement. As seen illustratively, the smart card module may have a sufficiently high stability, with the result that a smart card having a substantially planar surface can be provided by means of the smart card module being laminated and/or pressed between the at least two carrier layers, without cutouts for the smart card module having previously been provided in the carrier layers.

Various embodiments are based on the insight, for example, that a mechanically stabilized smart card module, as described herein, can be pressed between a plurality of carrier layers (e.g. polymer films) in such a way that the surface contour of the smart card module stands out only to a small extent on the exterior surface of the carrier layers. Consequently, it is possible to embed a smart card module between two carrier layers, without previously structuring the carrier layers for this purpose (that is to say without producing specific cutouts for receiving the smart card module). During the process of pressing the smart card module between the carrier layers, for example, the material of the carrier layers above and below (in the vicinity of) the smart card module is correspondingly densified, with the result that the volume of the smart card module that is received between the carrier layers can be or is compensated for.

Furthermore, another aspect of various embodiments may illustratively be seen in the fact that by means of a mechanically stable or stabilized smart card module, the material density of the carrier layers can be increased in the corresponding regions around the embedded smart card module, with the result that the smart card module can be embedded between the carrier layers, without a receptacle region for receiving the smart card module being cut out in the carrier layers, wherein the surface of the smart card (the smart card is formed by the carrier layers) can nevertheless be substantially planar, with the result that illustratively the embedding position of the smart card module within the smart card is not visible.

In accordance with various embodiments, a method for producing a smart card module arrangement can include the following: arranging a smart card module on a first carrier layer wherein the first carrier layer is free of a prefabricated smart card module receptacle cutout for receiving the smart card module. The smart card module includes: a substrate; a chip on the substrate; and a first mechanical reinforcement structure between the chip and the substrate. The first mechanical reinforcement structure covers at least one part of a surface of the chip; applying a second carrier layer to the smart card module. The second carrier layer is free of a prefabricated smart card module receptacle cutout for receiving the smart card module; and laminating and/or pressing the first carrier layer with the second carrier layer, such that the smart card module is enclosed by the first carrier layer and the second carrier layer.

In accordance with various embodiments, a method for producing a smart card module arrangement may include the following: arranging a smart card module between a first carrier layer and a second carrier layer. The first carrier layer includes a first material and the second carrier layer includes a second material, laminating and pressing the first carrier layer with the second carrier layer, wherein the smart card module, which has a first volume, is received by the first carrier layer and the second carrier layer. A material density of the first material and of the second material is increased during pressing on account of the received first volume of the smart card module.

In this case, the smart card module can illustratively withstand pressing without being damaged by virtue of the fact that said smart card module includes, for example, a flexible substrate and a reinforcement structure for reinforcing the chip. In other words, the smart card module can be stabilized and/or reinforced.

In accordance with various embodiments, a smart card module arrangement may include the following: a first carrier layer and a smart card module, arranged above the first carrier layer. The smart card module includes: a substrate, a chip on the substrate and a first mechanical reinforcement structure between the chip and the substrate. The first mechanical reinforcement structure covers at least one part of a surface of the chip; a second carrier layer above the smart card module. The first carrier layer is laminated with the second carrier layer, with the result that the smart card module is enclosed fully circumferentially by the first carrier layer and the second carrier layer in such a way that the smart card module is in physical contact fully circumferentially with the first carrier layer and with the second carrier layer respectively.

In accordance with various embodiments, a smart card module arrangement may include the following: a first carrier layer, wherein the first carrier layer is free of a prefabricated smart card module receptacle cutout for receiving the smart card module and a smart card module, arranged above the first carrier layer. The smart card module includes: a substrate; a chip on the substrate; and a first mechanical reinforcement structure between the chip and the substrate. The first mechanical reinforcement structure covers at least one part of a surface of the chip. The smart card module arrangement may further include a second carrier layer arranged above the smart card module. The second carrier layer is free of a prefabricated smart card module receptacle cutout for receiving the smart card module. The first carrier layer is laminated with the second carrier layer in such a way that the smart card module is enclosed by the first carrier layer and the second carrier layer.

In accordance with various embodiments, a smart card module arrangement may include the following: a carrier structure including a carrier material; a smart card module, embedded into the carrier structure, wherein the smart card module includes: a substrate, a chip on the substrate and a first mechanical reinforcement structure between the chip and the substrate, wherein the first mechanical reinforcement structure covers at least one part of a surface of the chip; wherein the carrier structure has a first region below the smart card module and a second region above the smart card module; and wherein the carrier material of the carrier structure is densified in the first region and/or in the second region on account of the embedded smart card module. In this case, the carrier structure can include a first carrier layer and a second carrier layer, wherein the smart card module is embedded between the first carrier layer and the second carrier layer. Moreover, the first region can be arranged in the first carrier layer and the second region can be arranged in the second carrier layer.

In accordance with various embodiments, the substrate may include plastic (or a polymer) or consist of plastic (or a polymer).

In accordance with various embodiments, the smart card module may furthermore include an antenna structure arranged on the substrate.

In accordance with various embodiments, the smart card module may furthermore include a second mechanical reinforcement structure above the chip on a side opposite the side on which the first mechanical reinforcement structure is arranged, wherein the second mechanical reinforcement structure can cover at least one part of a surface of the chip.

In accordance with various embodiments, the first carrier layer and/or the second carrier layer may include plastic (a polymer) or essentially consist of plastic (a polymer).

In accordance with various embodiments, the first carrier layer may be laminated and/or pressed with the second carrier layer in such a way that the smart card module is enclosed fully circumferentially by the first carrier layer and the second carrier layer in such a way that the smart card module is in physical contact fully circumferentially with the first carrier layer and with the second carrier layer, respectively.

In accordance with various embodiments, the smart card module arrangement can furthermore include a booster antenna structure, which can be arranged on the first carrier layer and/or the second carrier layer.

In accordance with various embodiments, a method for producing a smart card may include the following: producing a smart card module arrangement as described herein; and applying at least one additional layer (e.g. a third carrier layer), with the result that a smart card is formed. In other words, a smart card can be formed by means of one or a plurality of additional layers, wherein the smart card module or the smart card module arrangement can be embedded into the smart card.

In accordance with various embodiments, a smart card may include: a smart card module arrangement as described herein; and at least one additional layer on the smart card module arrangement. In other words, the smart card module arrangement may be processed by means of further layers (polymer layers) to form a smart card.

In accordance with various embodiments, the smart card may be a contactless smart card or the smart card may be formed as a contactless smart card. By way of example, the carrier layers and the additional layer may be free of electrical contacts exposed toward the outside.

In accordance with various embodiments, the antenna structure of the smart card module may be welded by means of ultrasound. In accordance with various embodiments, the booster antenna structure may be applied on the first carrier layer and/or the second carrier layer by means of ultrasonic welding.

In accordance with various embodiments, the substrate of the smart card module may have a thickness in a range of approximately 10 µm to approximately 50 µm, e.g. a thickness in a range of approximately 12 µm to approximately 25 µm.

In accordance with various embodiments, the first carrier layer and/or the second carrier layer may include at least one material of the following group of materials: a thermoplastic, e.g. polyvinyl chloride (PVC), a polycarbonate (PC), polyester, Teslin®, a synthetic terpolymer, e.g. acrylonitrile-butadiene-styrene copolymer (ABS), or the like.

In accordance with various embodiments, the smart card may have a thickness in a range of approximately 760 µm to approximately 840 µm, e.g. in accordance with the ISO/IEC 7810 standard and/or ISO/IEC 7813 standard (ID1 card). Furthermore, the smart card may have the dimensions of 85.6 mm×53.98 mm×0.76 mm, or corresponding dimensions with a small deviation (±10%). In accordance with various embodiments, the smart card can be designed (at least partly) according to the ISO/IEC 7810 standard, ISO/IEC 7813 standard, ISO/IEC 7816 standard and/or ISO/IEC 14443 standard.

In accordance with various embodiments, the smart card module may have a thickness in a range of approximately 50 µm to approximately 160 µm, e.g. a thickness in a range of approximately 100 µm to approximately 110 µm.

In accordance with various embodiments, the first carrier layer and/or the second carrier layer may have a thickness in a range of approximately 100 µm to approximately 200 µm, e.g. a thickness in a range of approximately 125 µm to approximately 150 µm (for forming a prelaminate).

In accordance with various embodiments, a so-called contactless smart card module is described, wherein the smart card module (the so-called package) may include a flexible substrate, e.g. a polyimide film, wherein the antenna (or the antenna structure) can be provided in continuous coil form by means of a one-sided or double-sided metallization. In this case, the antenna can be coupled to a chip which can be fixed (adhesively bonded or soldered) on one side of the substrate. Furthermore, the chip can be a flexible chip, i.e. have a thickness such that the chip can bend under a mechanical loading, without breaking. Furthermore, the chip, as described in greater detail below, can be stabilized by means of a reinforcement structure, wherein the reinforcement structure can be arranged, for example, between the chip and the substrate. In this case, the mechanical properties of the smart card module can result from the properties (e.g. from the respective thickness and from the respective material) of the substrate, of the chip and of the reinforcement structure or can be adapted by means thereof.

In accordance with various embodiments, a smart card module is described below. In order to provide a smart card module (or a chip module, a smart card and/or a chip package) which is insensitive or resistant to a mechanical loading, for example, flexible materials and/or flexible components can be used, for example. A smart card module may include a flexible carrier, for example, on which a flexible chip is arranged and/or fixed, with the result that this flexible (or pliable, or deformable) smart card module may compensate for a mechanical loading or can withstand a mechanical loading, without breaking or being damaged, for example.

A mechanical loading may be understood herein to mean, for example, the following: a mechanical pressure, a mechanical stress, a torsional stress, a bending stress, a deformation, an elongation, a bending, a tensile stress, a compressive stress, an elastic deformation, a punctiform loading or force, and the like. Such a mechanical loading can occur both during use of the smart card in which the smart card module can be integrated, and during the production of the smart card itself, that is to say for example during the embedding (integration) of the smart card module into the smart card housing for providing the smart card. As is described herein, during lamination and/or pressing of a smart card module between two carrier layers, for example, the smart card module can be subjected to a mechanical loading. Conventional smart card modules can be damaged, for example, in the case of such loading during lamination or pressing of a smart card module into a carrier layer.

In accordance with various embodiments, the substrate (or the carrier) for providing a smart card module can be formed from a flexible material, e.g. a plastic or polymer, and/or have a corresponding thickness, with the result that the substrate is flexible. The substrate can have a thickness of less than 100 µm, for example, with the result that the substrate can be flexible or pliable. The chip of the smart card module, which chip can be arranged on the flexible substrate, for example, can have a thickness of less than or equal to 100 µm and include silicon. Such a thin or ultrathin silicon chip can be flexible (e.g. pliable or reversibly deformable), with the result that the chip can withstand a mechanical loading, for example without breaking.

In accordance with various embodiments, in addition to the pure mechanical stability of a chip and/or of a smart card module, the stability of the electrical connections and line routings of the chip and/or of the smart card module can also be of importance. A smart card module can include, for example, one or a plurality of metallization structures (metallizations or metallization layers), including for example an electrical conduction structure and a dielectric layer structure which can enable and/or provide the electrical functionality of the smart card module. The metallization structures or other electrical conductor structures (for example an antenna structure) can have a lower flexibility than the silicon base of the chip itself and thus be susceptible to damage. Furthermore, a metallization structure can be under mechanical stress which can be introduced into the metallization structure in a manner governed by production. Therefore, by way of example, an excessively high flexibility of the smart card module can in turn be disadvantageous since, for example, a metallization structure or line routing cannot withstand an excessively great deformation of the smart card module.

Therefore, a smart card module whose mechanical properties are substantially defined for example by the mechanical properties of the chip and the thickness thereof, as the thickness of the chip decreases, can have a higher mechanical flexibility and thus withstand a higher mechanical loading without breaking. A silicon chip can for example be brittle and tend toward breaking if the thickness of the chip exceeds a specific thickness, for example a thickness of more than approximately 100 µm. On the other hand, by way of example, a metallization structure of the smart card module can lose the electrical functionality in the case of a mechanical loading, even though the chip of the smart card module may not yet be broken, for example. By way of example, in the case of a mechanical loading, the chip of the smart card module can bend on account of its mechanical flexibility, and so the chip is not destroyed, but the electrical lines in the metallization structure of the smart card module or of the chip can be interrupted in this case. Therefore, the line routing of a chip or smart card module can necessitate mechanical reinforcement of at least the chip of the smart card module or part of the smart card module, for example by means of a local reinforcement structure. In this case, by way of example, a chip of the smart card module can be mechanically stabilized by means of a plurality of reinforcement structures. Furthermore, the stiffness of the substrate of the smart card module which carries the chip, for example, can be increased by means of one or a plurality of reinforcement structures at least in one region of the substrate.

In order to achieve an improved stability of the smart card module (or of the chip of the smart card module), the mechanical deformation properties (for example the stiffness) of the substrate, of the chip and/or of the reinforcement structures can be adapted. In this case, a balance can be provided between mechanical protection against breaking and protection of the metallization structure of the chip or of the metallization structure of the smart card module.

In accordance with various embodiments, a region of the substrate can be reinforced (supported and/or stiffened), for example the region in which (or above which) the chip is arranged, while the remaining region of the substrate can be made flexible, for example the remaining region of the substrate in which an antenna structure can be arranged. This can be achieved, for example, by providing a flexible substrate (for example having a thickness in a range of approximately 10 µm to approximately 50 µm), wherein a metal layer which is relatively thick in comparison with the thickness of the substrate (for example having a thickness in a range of approximately 30 µm to approximately 50 µm) can be arranged in each case on the top side and the underside of the substrate, wherein the metal layers on the top side and the underside of the substrate can have a similar size. In this case, the metal layers can serve as supporting structures, stiffening structures and/or reinforcement structures for the chip, the smart card module and/or a region of the substrate. Furthermore, by way of example, at least one reinforcement structure (metal layer) can be designed in such a way that it can support, stiffen and/or reinforce the chip, the smart card module and/or a region of the substrate.

In accordance with various embodiments, the finished package (the finished processed smart card module) can be laminated using multilayer technology centrally into a smart card or into a smart card housing. The signal coupling between the smart card module and a peripheral device (e.g. a card reader for communicating with the smart card module or with the chip of the smart card module) can take place contactlessly, for example, e.g. by means of the antenna of the smart card module and the booster antenna of the smart card (or of the smart card housing).

Furthermore, by way of example, the surface contour of the finished processed smart card can be a quality feature during smart card production, wherein the smart card is intended to have card surfaces which are as planar as possible, with the result that, for example, the installation position of the smart card module cannot be visible or can be visible only with difficulty. The method described herein is intended to foster the production of a planar smart card surface and at the same time to simplify the smart card production process.

In general, a smart card module can be embedded between two carrier layers, wherein a cutout for the chip can be situated in the upper carrier layer and a cutout for the substrate can be situated in the lower carrier layer. In this case, the initial material thickness of the carrier layers can be chosen to be somewhat thicker than the total thickness of the smart card module to be produced (for example, for producing a smart card module having a thickness of approximately 200 µm, it is possible to use two carrier layers each having a thickness of approximately 105 µm), with the result that the interspaces between the metal conductor tracks and the spacings between chip and substrate and the cutouts can be filled by the surrounding card material during lamination.

Problems can arise in this case, however, since besides these material availability measures, for example, the smart card module stands out clearly in the card body after lamination. Furthermore, providing the cutouts in the carrier layers can necessitate a complicated and cost-intensive production process, for example.

By means of the thin and nevertheless mechanically robust (stable) embodiment of the smart card module as described herein, the smart card module can be laminated in between two layers of plastic (PVC, PC, or a polymer), without the layers of plastic having to be provided with cutouts. In this case, the smart card module can withstand the lamination (and, for example, pressing or lamination under pressure) without damage. This production process can be used for example cost-effectively and at the same time efficiently with a simple process sequence. In this case, the simplified process implementation can lead to significant cost savings and at the same time to a high-quality smart card in which the smart card module no longer stands out on the smart card surface, for example, which may be attributable, for example, to the fact that the volume additionally produced on account of the smart card module is compensated for by a material densification of the layers of plastic, which material densification arose or arises in the lamination process, which, in the final smart card production process, can lead to a total card thickness which is partially increased only to an insignificant extent.

FIG. 1A illustrates, in a schematic flow chart, a method 100a for producing a smart card module arrangement, wherein the method can include: in 110, arranging a smart card module on a first carrier layer; in 120, applying a second carrier layer to the smart card module; and, in 130, laminating and/or pressing the first carrier layer with the second carrier layer, with the result that the smart card module is enclosed by the first carrier layer and the second carrier layer. In this case, the first carrier layer can be free of a prefabricated smart card module receptacle cutout for receiving the smart card module. Furthermore, the second carrier layer can be free of a prefabricated smart card module receptacle cutout for receiving the smart card module. Furthermore, the first carrier layer and the second carrier layer can be free of a prefabricated smart card module receptacle cutout for receiving a respective part of the smart card module.

As seen illustratively, the first carrier layer and the second carrier layer, in the region into which the smart card module is intended to be embedded, can have no prefabricated cutouts, that is to say that that region of the first carrier layer above which the smart card module is arranged can be free of a prefabricated cutout, and that region of the second carrier layer which is arranged above the smart card module can likewise be free of a prefabricated cutout.

In this case, the term "prefabricated" in the sense of the prefabricated cutout can be understood such that this does not involve small, naturally occurring (occurring as an intrinsic property of a polymer carrier layer) cavities, indentations, depressions and/or the like, that is to say for example does not involve a cutout of an order of magnitude which is significantly smaller than the volume occupied by the smart card module. In this case, cutouts which for example are smaller than 20% of the volume of the smart card module cannot be regarded as prefabricated cutouts. In other words, a prefabricated cutout, relative to its spatial dimensioning (or the volume), can be in a similar range (±50%) to, or of the same order of magnitude as, the spatial dimensioning (or the volume) of the smart card module.

Furthermore, the smart card module can include the following: a substrate; a chip on the substrate; and a first mechanical reinforcement structure between the chip and the substrate, wherein the first mechanical reinforcement structure covers at least one part of a surface of the chip. In accordance with various embodiments, the first mechanical reinforcement structure (also designated herein as reinforcement structure) can cover one or more surfaces of the chip or adjoin one or more surfaces of the chip. Furthermore, the first mechanical reinforcement structure can be arranged at least partly on that surface of the substrate which lies opposite that surface on which the chip is fixed, that is to say the first mechanical reinforcement structure can be arranged at least partly on that surface of the substrate which is directed away from the chip.

As is illustrated in FIG. 1B, in a schematic flow chart, a method 100b for producing a smart card, proceeding from the method 100a for producing a smart card module arrangement, can furthermore include: in 140, applying at least one additional layer, with the result that a smart card is formed.

FIG. 2A to FIG. 2E illustrate a smart card module arrangement 200a, or a smart card 200b, in each case in a schematic side view or cross-sectional view after different process sections during the method 100a for producing a smart card module arrangement 200a, or during the method 100b for producing a smart card 200b.

As is illustrated in FIG. 2A, a smart card module arrangement 200a, e.g. after the process 110 of the method 100a or of the method 100b has been carried out, can include a first carrier layer 202a, wherein a smart card module 206 can be arranged above the first carrier layer 202a or above a first region 204a of the first carrier layer 202a. In this case, the smart card module 206 can be placed onto the first carrier layer 202a or held above the first carrier layer 202a.

In accordance with various embodiments, by way of example, the smart card module 206 can include a substrate, on which a chip 206c can be fixed, wherein a reinforcement structure 206v can furthermore be established between the substrate 206s and the chip 206c. Alternatively, the reinforcement structure 206v can be arranged for example above the chip 206c or both above and below the chip 206c (cf., for example, FIG. 3A to FIG. 3D and FIG. 4).

In accordance with various embodiments, the chip 206c can be a chip arrangement or a flexible chip arrangement; by way of example, the chip 206c can be arranged in a flexible chip housing or the chip 206c can be stabilized by means of one flexible stabilization layer or by means of a plurality of flexible stabilization layers.

Furthermore, the reinforcement structure 206v (e.g. the first mechanical reinforcement structure 206v) can include or essentially consist of at least one of the following materials: a metal, a metallic material, an alloy, an intermetallic compound, copper, aluminum, titanium, titanium nitride, tungsten, doped silicon (polysilicon).

In accordance with various embodiments, the surface of the first carrier layer 202a can define a lateral direction 203. Furthermore, the spatial extent of the first carrier layer 202a perpendicular to the lateral direction can define the thickness 201*a* of the first carrier layer 202*a*.

In accordance with various embodiments, the reinforcement structure 206*v* can have a thickness (e.g. a spatial extent perpendicular to the lateral direction 203), in a range of approximately 5 µm to approximately 100 µm, e.g. a thickness in a range of approximately 10 µm to approximately 80 µm, e.g. in a range of approximately 20 µm to approximately 60 µm. In accordance with various embodiments, the first reinforcement structure 206*v* can have a thickness of approximately 40 µm.

In accordance with various embodiments, the stiffness of the reinforcement structure 206*v* can thus be greater than the stiffness of the substrate 206*s*, with the result that a region of the substrate 102 can be stabilized by means of the reinforcement structure 206*v*, while the remaining region of the substrate 206*s* can remain flexible. By way of example, an antenna or an antenna structure can be arranged in the remaining flexible region of the substrate 206*s*. Furthermore, the stiffness of the reinforcement structure 206*v* can contribute to the stabilization of the chip 206*c*, with the result that the chip 206*c* can be more resistant to a mechanical loading.

In accordance with various embodiments, the chip 206*c* can have a chip thickness (e.g. a spatial extent perpendicular to the lateral direction 203), wherein the chip thickness can be less than approximately 110 µm, e.g. less than 100 µm, e.g. the chip thickness can be in a range of 5 µm to approximately 100 µm.

In accordance with various embodiments, the substrate 206*s* can be a carrier film, wherein the substrate 206*s* can include or may essentially consist of a plastic and/or a polymer. The substrate 206*s* may for example essentially consist of polyimide or include polyimide. Furthermore, the substrate 206*s* may for example essentially consist of PVC (polyvinyl chloride) and/or PC (polycarbonate) or include PVC and/or PC. Furthermore, the substrate 206*s* can have a thickness (e.g. a spatial extent perpendicular to the lateral direction 203) in a range of approximately 1 µm to approximately 100 µm, e.g. in a range of approximately 5 µm to approximately 50 µm, e.g. the substrate 206*s* can have a thickness in a range of approximately 20 µm to approximately 30 µm.

In accordance with various embodiments, the reinforcement structure 206*v* can cover at least 50% of the chip 206*c* or of the surface of the chip.

In accordance with various embodiments, the first carrier layer can be processed from roll to roll, for example.

Figure 2B:
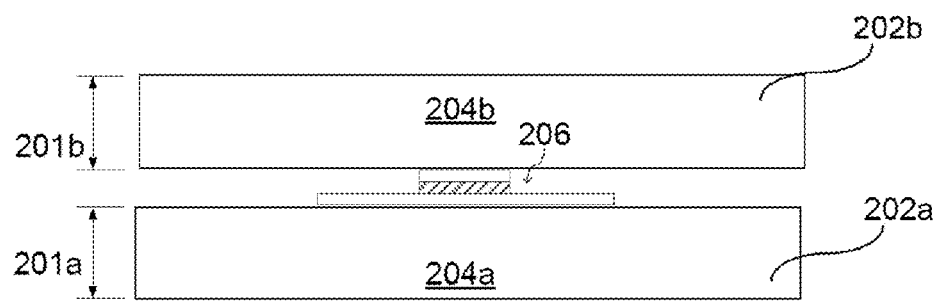

As is illustrated in FIG. 2B, a second carrier layer 202*b* can be arranged (positioned) above the first carrier layer 202*a* and above the smart card module 206, for example in the process 120 of the method 100*a* or of the method 100*b*. In this case, the second region 204*b* of the second carrier layer 202*b* can be positioned above the smart card module 206, or the second region 204*b* of the second carrier layer 202*b* is defined as the region which is positioned above the smart card module 206.

As seen illustratively, the first region 204*a* of the first carrier layer 202*a* and the second region 204*b* of the second carrier layer 202*b* can be arbitrary regions of the respective carrier layer, that is to say not specially prefabricated.

Figure 2C:
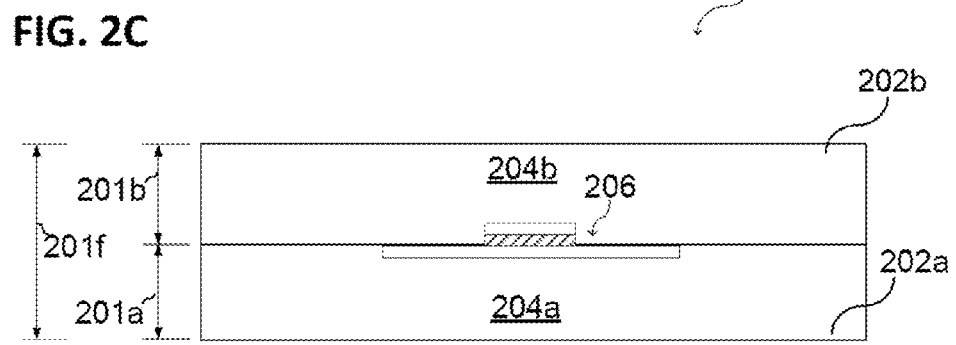
FIG. 2C shows a smart card module arrangement in a schematic side view or cross-sectional view, in accordance with various embodiments.

FIG. 2C illustrates, in a schematic side view or cross-sectional view, a smart card module arrangement 200*a*, for example after process 130 of the method 100*a* or 100*b* has been carried out. The smart card module 206 can be embedded between the first carrier layer 202*a* and the second carrier layer 202*b*. The embedding of the smart card module 206 can be carried out for example by means of lamination, e.g. by means of cold lamination or hot lamination, or by means of lamination and additional pressing. Alternatively, the embedding of the smart card module 206 can be carried out by means of pressing.

In accordance with various embodiments, the embedding of the smart card module 206 between the carrier layers 202*a*, 202*b* or the embedding of the smart card module 206 into the common laminated carrier layer structure (carrier structure), wherein illustratively a common carrier layer structure arises from the two carrier layers 202*a*, 202*b* during lamination, can be carried out in such a way that the smart card module 206 is completely surrounded by the carrier layers 202*a*, 202*b* or the carrier layer structure (or by the carrier material of the carrier layers 202*a*, 202*b* or of the carrier layer structure). In other words, the smart card module 206 can be surrounded laterally fully circumferentially by the carrier material of the carrier layers 202*a*, 202*b* or of the carrier layer structure and at the same time can be completely covered both from above and from below by the carrier material of the carrier layers 202*a*, 202*b* or of the carrier layer structure. In this case, the carrier layers 202*a*, 202*b* or the carrier layer structure (the carrier material of the carrier layers 202*a*, 202*b* or of the carrier layer structure) can be in direct contact with the smart card module 206.

In accordance with various embodiments, the thickness 201*a* of the first carrier layer 202*a* can be equal to the thickness 201*b* of the second carrier layer 202*b*. As seen illustratively, the respective thickness of the carrier layers can be reduced in the regions 204*a*, 204*b*, on account of the lamination and/or pressing of the smart card module 206 into the carrier layers. In this case, the carrier material of the carrier layers can be compressed, that is to say densified, in the regions 204*a*, 204*b* (the mass density of the carrier material in the regions 204*a*, 204*b* can be locally increased). This densification of the carrier material in the regions 204*a*, 204*b* can make it possible (caused on the basis of the method 100*a*, 100*b*), for example, that the smart card module 206 can be embedded into the carrier layers, wherein the received volume of the smart card module 206 can be at least partly compensated for by virtue of the fact that the carrier material of the carrier layers is densified, and the densified carrier material of the carrier layers in the regions 204*a*, 204*b* thus provides space for the smart card module 206. Consequently, illustratively, there is only an insignificant increase in the total thickness 201*f* of the smart card module arrangement 100 in the region in which the smart card module 206 is received.

In other words, the received volume of the smart card module 206 in the carrier structure 202*a*, 202*b* is compensated for at least partly (e.g. to the extent of more than 30%, e.g. to the extent of more than 50%, e.g. to the extent of more than 70%, e.g. to the extent of more than 90%) by means of the carrier material densification caused (that is to say the volume reduction and in association the local density increase in the regions 204*a*, 204*b* of the carrier layers 202*a*, 202*b*).

In accordance with various embodiments, the smart card module arrangement 200*a*, as illustrated in FIG. 2C, can be an intermediate stage for producing a smart card 200*b*, wherein the smart card 200*b* includes the smart card module arrangement 200*a*.

Figure 2D:
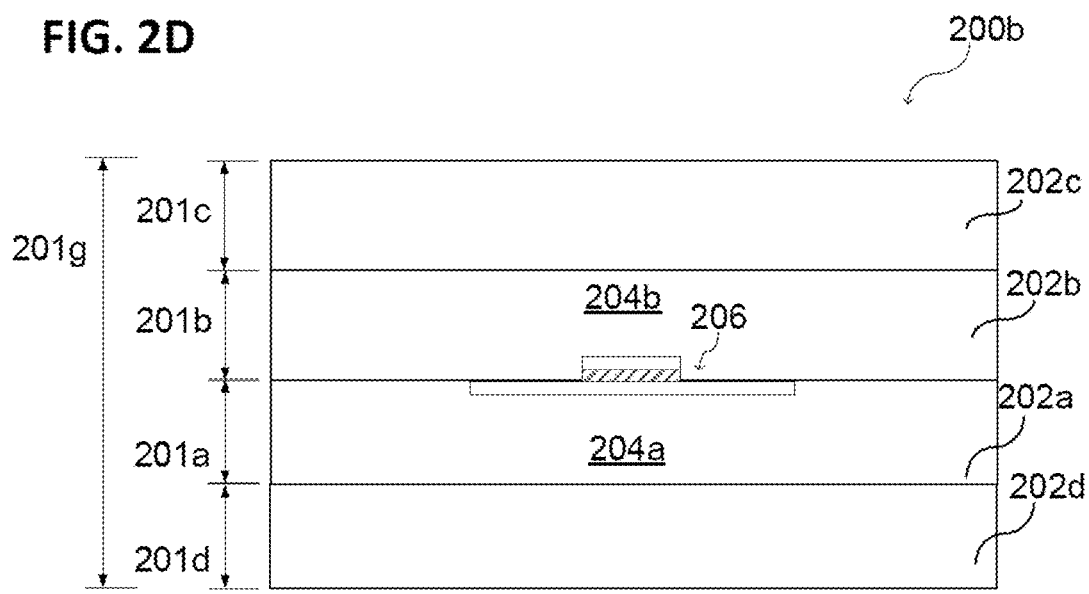
FIG. 2D shows a smart card in a schematic side view or cross-sectional view, in accordance with various embodiments.

FIG. 2D illustrates a smart card 200*b* or a part of a smart card in a schematic side view or cross-sectional view. The smart card module arrangement 200*a* can be introduced and laminated (and/or pressed) between two further carrier layers 202c, 202d, for example, with the result that a smart card 200b is formed.

In accordance with various embodiments, the carrier layers 202a, 202b, 202c, 202d may essentially consist of the same carrier material or include the same carrier material, e.g. PVC or PV or some other plastic. Furthermore, the carrier layers 202a, 202b, 202c, 202d may essentially consist of different carrier materials or include different carrier materials.

In accordance with various embodiments, the respective thickness 201a, 201b, 201c, 201d of the carrier layers 202a, 202b, 202c, 202d can be adapted or selected in such a way that the total thickness 201g of the smart card 200b is in a range of approximately 600 μm to approximately 1000 μm, e.g. in a range of approximately 0.8 mm.

Furthermore, the smart card module arrangement 200a or the smart card 200b can include one or more additional functional layers, e.g. security layers, or layers which are intended to protect the smart card module 206 against analysis and/or manipulation. In accordance with various embodiments, the smart card 200b can additionally include a printing layer (on which a motif, for example, can be applied) and/or an anti-scratch protective layer (anti-scratch protective film). Furthermore, the smart card can additionally include a personalization layer structure or security layer structure which is or has been treated for example by means of a laser (e.g. up to eight layers welded to one another or more than eight layers welded to one another in the smart card for personal identification (personal identity card)).

Figure 2E:
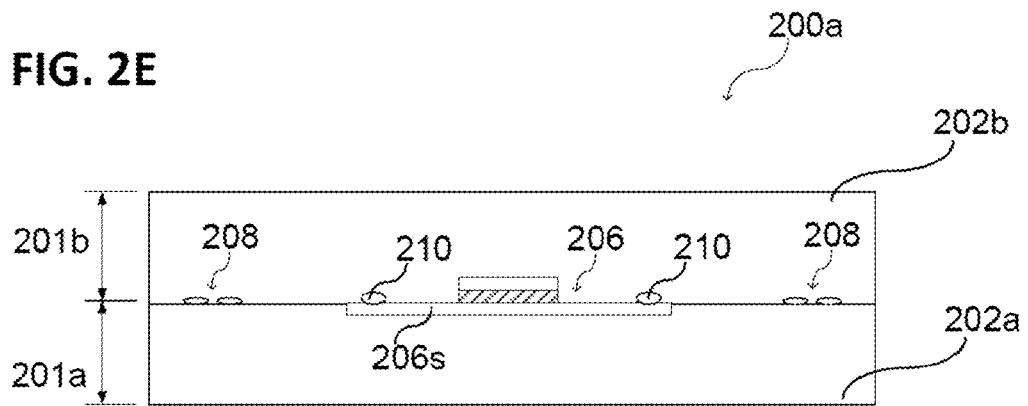
FIG. 2E shows a smart card module arrangement in a schematic side view or cross-sectional view, in accordance with various embodiments.

As is illustrated in FIG. 2E, the smart card module 206 can include an antenna 210 or an antenna structure 210 for the contactless transmission of data, e.g. for communication with the surroundings or with an external component (device). Furthermore, the smart card 200b and/or the smart card module arrangement 200a can include a further antenna 208 or a further antenna structure 208, a so-called booster antenna 208 or booster antenna structure 208 for amplifying the transmission power and/or the reception power of the smart card module 206, wherein the booster antenna 208 or booster antenna structure 208 can be inductively coupled to the antenna 210 or antenna structure 210 of the smart card module 206; by way of example, the antenna 210 of the smart card module 206 and the booster antenna 208 can be provided in each case in coil form (as so-called coils), wherein the booster antenna 208 surrounds and thus inductively couples the antenna 210 of the smart card module 206.

In accordance with various embodiments, the antenna 210 or the antenna structure 210 of the smart card module 206 can be arranged and established on the substrate 206s (e.g. on one surface of the substrate 206s or on both surfaces of the substrate 206s). Furthermore, the booster antenna 208 or the booster antenna structure 208 can be arranged and established on the carrier layer (e.g. on the first carrier layer 202a and/or on the second carrier layer 202b).

In accordance with various embodiments, the chip 206c of the smart card module 206 can communicate by means of the antenna or the antenna structure and/or by means of the booster antenna or booster antenna structure. The communication can be effected for example by means of electromagnetic radiation (e.g. RF or radio frequency) having a frequency in a range of approximately 100 kHz to approximately 14 MHz, e.g. having a frequency of approximately 13.56 MHz.

Various modifications and configurations of the smart card 200b, of the smart card module arrangement 200a and details concerning the smart card module 206 are described below, wherein the fundamental features and methods of functioning described with regard to the figures described above can be included analogously. Furthermore, the features and methods of functioning described below can be analogously applied to the smart card 200b or smart card module arrangement 200a described in FIG. 2A to FIG. 2E or be combined therewith.

Figure 3A:
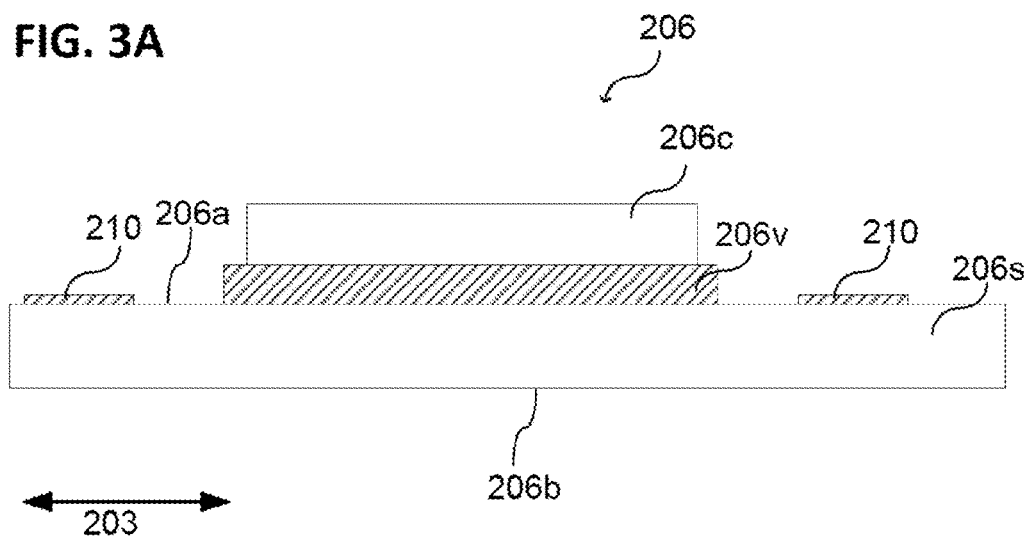

FIG. 3A shows a schematic cross-sectional view or side view of a smart card module 206, wherein the smart card module 206 can be established analogously to the description above, and wherein an antenna 210 (or antenna structure 210) is furthermore arranged on the substrate 206s. The antenna 210 can be arranged for example on that side 206a of the substrate 206s on which the chip 206c is also arranged. In other words, the chip 206c and the antenna 210 can be arranged on the same side of the substrate 206s. Furthermore, the antenna 210 can also be arranged on that side 206b of the substrate 206s which is opposite to the side 206a.

In accordance with various embodiments, the antenna 210 or the antenna structure 210 may include or essentially consist of at least one of the following materials: a metal, a metallic material, an alloy, an intermetallic compound, copper, aluminum, titanium, titanium nitride, tungsten, doped silicon (polysilicon), gold, silver, nickel, zinc, an aluminum-silicon alloy.

Furthermore, the antenna 210 or the antenna structure 210 may include or essentially consist of a patterned layer, for example a patterned copper layer formed by means of copper etching technology, for example. Furthermore, the antenna 210 or the antenna structure 210 can include a patterned aluminum layer formed by means of aluminum etching technology, for example.

Figure 3B:
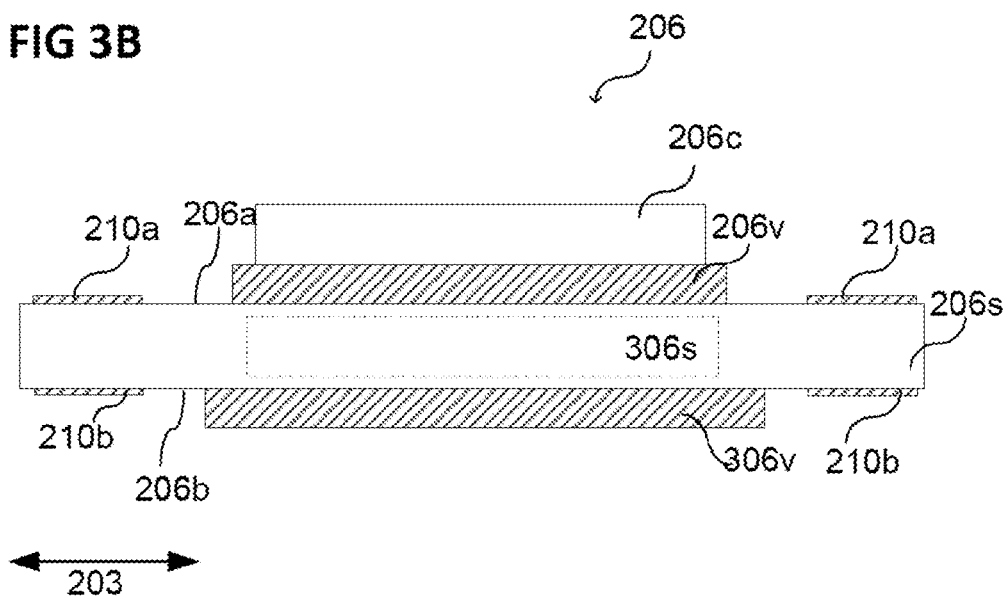

Furthermore, the smart card module 206 can be established in such a way that data transmission between the chip 206c and a periphery device can be carried out contactlessly by means of the antenna 210. Furthermore, the smart card module 206 can include a plurality of antennas 210a, 210b, as is illustrated in FIG. 3B. In this case, the first antenna 210a can be arranged on the first side 206a of the substrate 206s and the second antenna 210b can be arranged on the second side 206b of the substrate 206s. It goes without saying that the one antenna 210 or the plurality of antennas 210a, 210b can be electrically conductively connected to the chip 206c, with the result that data transmission is possible. Furthermore, the plurality of antennas 210a, 210b can form a common antenna structure 210; by way of example, the first antenna 210a and the second antenna 210b can be electrically conductively connected to one another by means of a plated-through hole through the substrate 206s.

Furthermore, the first reinforcement structure 206v can be arranged on the surface 206a between the chip 206c and the substrate 206s, wherein the lateral extent of the first reinforcement structure 206v can be greater than the lateral extent of the chip 206c. In this case, the chip 206c can be fixed on the first reinforcement structure 206v by means of underfilling (by means of an underfill process). In this case, by way of example, at least one part of the first reinforcement structure 206v can be enveloped by an underfill material. The underfill material can cover for example the sides of the first reinforcement structure 206v.

Furthermore, a second reinforcement structure 306v can be established and/or arranged on the second side 206b of the substrate 206s of the smart card module 206.

FIG. 3B shows a schematic cross-sectional view or side view of a smart card module 206 including a substrate 206s, a first reinforcement structure 206v applied on the first side 206a of the substrate 206s, and a second reinforcement structure 306v, wherein the second reinforcement structure 306v is established and/or arranged on the second side 206b of the substrate 206s, wherein the second side 206b of the substrate 206s, wherein the second side 206b of the substrate 206s can be opposite the first side 206a.

In accordance with various embodiments, the first reinforcement structure 206v and/or the second reinforcement structure 306v can be formed or have been formed by means of chemical vapor deposition (CVD) or by means of physical vapor deposition (PVD). Furthermore, the first reinforcement structure 206v and/or the second reinforcement structure 306v can be formed or have been formed by means of an electrochemical or electrolytic process.

Furthermore, forming the first reinforcement structure 206v and/or the second reinforcement structure 306v can include at least one or more of the following processes: a lithography process, an etching process, a patterning process, chemical mechanical polishing (CMP), a layer deposition process (so-called layering), a copper etching process, an aluminum etching process.

In accordance with various embodiments, the first reinforcement structure 206v and/or the second reinforcement structure 306v can be formed by one or a plurality of deposited layers being patterned, for example by means of one etching process or by means of a plurality of etching processes.

By way of example, a copper layer and/or an aluminum layer can be deposited on at least one part of the substrate 206s. Furthermore, the copper layer (or aluminum layer) can be patterned. In accordance with various embodiments, a mask (e.g. a photolithography mask) can be applied to the substrate 206s, with the result that at least one region of the carrier is correspondingly exposed, and subsequently the first reinforcement structure 206v and/or the second reinforcement structure 306v (e.g. a copper layer or aluminum layer) can be formed in the exposed regions of the substrate 206s.

Furthermore, the antenna structure 210 (e.g. the first antenna 210a and/or the second antenna 210b) can be produced in the same process as the reinforcement structures 206v, 306v, e.g. in a common patterning step of a metal layer.

In accordance with various embodiments, the first reinforcement structure 206v and/or the second reinforcement structure 306v can be formed by means of the patterning of an applied layer on the substrate 206s, wherein the patterning can be carried out by means of a chemical or physical etching process, e.g. by means of wet etching or wet-chemical etching, or by means of dry etching.

A region 306s of the flexible substrate 206s can be reinforced and/or stabilized by means of the first reinforcement structure 206v and/or the second reinforcement structure 306v, wherein the chip 206c can be arranged above the reinforced and/or stabilized region 306s of the substrate 206s.

FIG. 3C shows a schematic cross-sectional view or side view of a smart card module 206 including a substrate 206s, a first reinforcement structure 206v, a second reinforcement structure 306v, and a chip 206c, wherein the chip 206c is fixed to the first reinforcement structure 206v. Furthermore, the chip 206c can also be fixed to the first reinforcement structure 206v by means of additional structures and by means of additional processes, e.g. by means of soldering, adhesive bonding, or by means of a suitable metallization process.

Furthermore, an antenna 210 can be established on the substrate 206s, or an antenna structure 210, as described above. In accordance with various embodiments, the first reinforcement structure 206v, the second reinforcement structure 306v and the antenna 210 can be formed by means of typical semiconductor industry processes, as described above.

Furthermore, the chip 206c can be an ultrathin chip or a thinned chip, for example a flexible chip, as described above.

As is illustrated in FIG. 3C, the chip 206c can be fixed to the substrate 206s or to the first reinforcement structure 206v by means of an underfill process, analogously to so-called flip-chip mounting. In this case, by way of example, solder balls 322 can provide an electrical contact structure between the chip 206v and the carrier and/or between the chip 206c and the antenna 210, wherein the chip 206c can be fixed to the first reinforcement structure 206v by means of the underfill material 320.

Furthermore, in this case, the underfill material 320 can enclose the first reinforcement structure 206v. Furthermore, the underfill material 320 and/or the first reinforcement structure 206v can at least partly enclose the chip 206c.

Furthermore, the smart card module 206 can include one or more protective layers or reinforcement layers, for example on the chip 206c or above the chip 206c.

As is illustrated in FIG. 3D, the chip 206c can be fixed to the substrate 206s or to the first reinforcement structure 206v by means of a soldering process, analogously to so-called flip-chip mounting. In this case, by way of example, contact structures 324 can provide an electrical contact between the chip 206c and the substrate 206s and/or between the chip 206c and the antenna 210, wherein the chip 206c can be fixed to the first reinforcement structure 206v by means of a soldering layer.

In accordance with various embodiments, the antenna 210 can be formed in a region of the substrate 206s which is not reinforced by means of the reinforcement structure 206v or by means of the reinforcement structures 206v, 306v. The antenna 210 can be arranged for example in a region around the chip 206c. In other words, the antenna 210 can be arranged at a lateral distance from the first reinforcement structure 206v and/or from the chip 206c.

Figure 4:
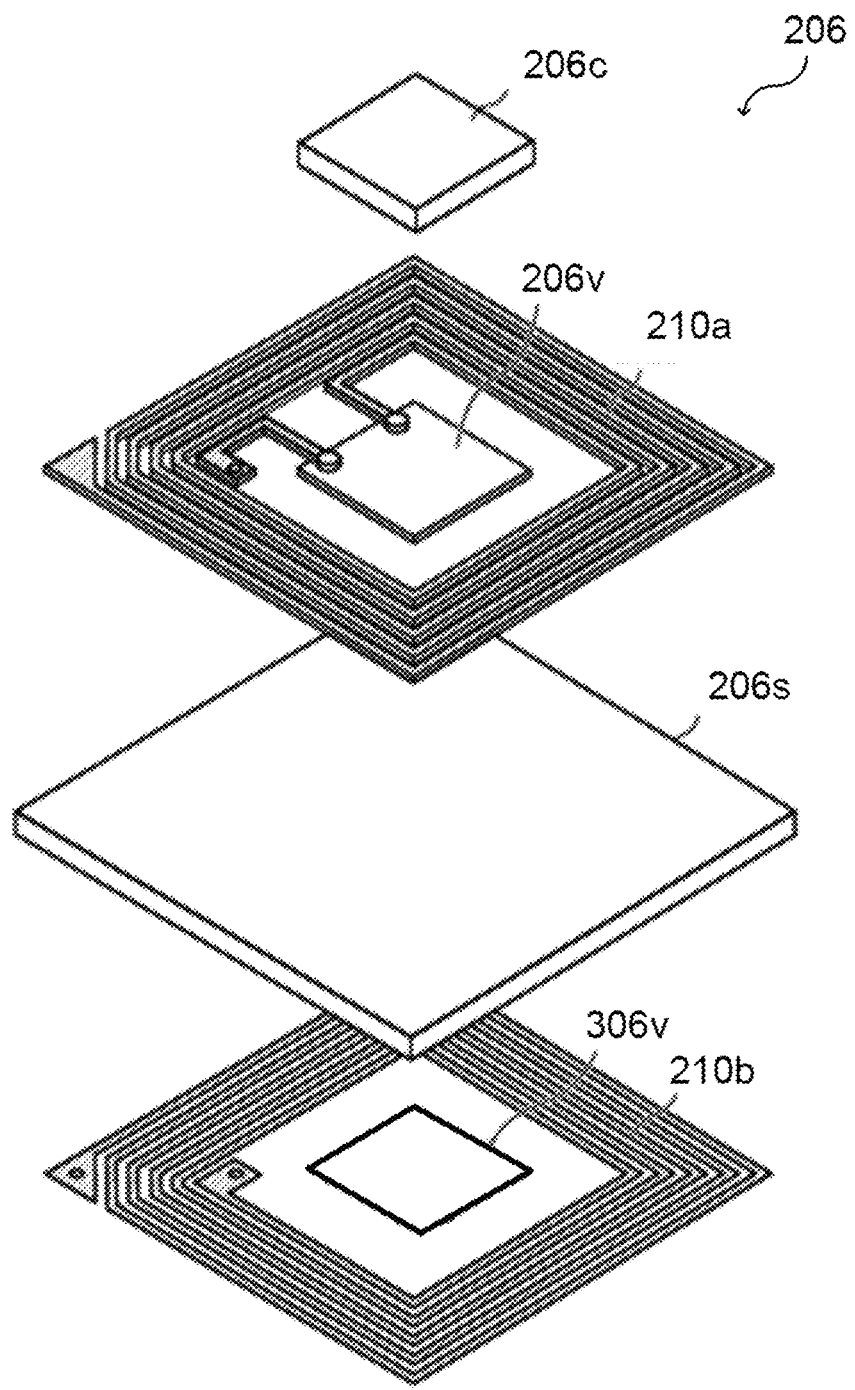
FIG. 4 shows a smart card module in an exploded illustration, in accordance with various embodiments.

FIG. 4 shows by way of example the construction of a smart card module 206 in accordance with various embodiments in a schematic exploded drawing. The first reinforcement structure 206v can be arranged for example on the first side of the substrate 206s. Furthermore, the first antenna 210a can be arranged on the first side of the substrate 206s, wherein the first antenna 210a can be electrically coupled (conductively connected) for example to the first reinforcement structure 206v. Furthermore, a chip 206c can be arranged on or above the first reinforcement structure 206v, with the result that the chip 206c is electrically conductively connected to the antenna 210 by means of the first reinforcement structure 206v. In accordance with various embodiments, therefore, in addition to the stabilizing and protective function, as described above, the first reinforcement structure 206v can also serve for making electrical contact with the chip 206c.

Furthermore, a second antenna 210b can be arranged on the second side of the substrate 206s, wherein the second antenna 210b can be electrically conductively connected to the first antenna 210a and/or to the chip 206c. In accordance with various embodiments, a second reinforcement structure 306v can be arranged on the second side of the carrier opposite the first reinforcement structure 206v and/or opposite the chip 206c, as described above. Furthermore, the first reinforcement structure 206v can be located within the chip area and be completely enclosed by the underfill.

Furthermore, the second reinforcement structure 306v can have an edge structure which can prevent or reduce tearing of the substrate 206s on account of a mechanical loading.

Furthermore, the second reinforcement structure 306v can have approximately the size of the chip area and can have for example an edge structure in the form that a straight shearing edge, formed by the first reinforcement structure 206v and the second reinforcement structure 306v and/or the chip 206c, is avoided. Illustratively, in this case, a lateral boundary of the second reinforcement structure 306v (an edge of the second reinforcement structure 306v) can be produced or provided in a manner similar to the form of the edge of a postage stamp, wherein the "jags" on the second side of the substrate project beyond the chip area.

In accordance with various embodiments, a flexible substrate 206s or a flexible chip 206c can change its form at least along one direction, wherein this deformation can be reversible, with the result that the chip 206c or the substrate 206s is not damaged and can in each case assume the original form again. The smart card module 206, as illustrated in FIG. 4, can be resistant for example to a mechanical pressure or a mechanical stress in such a way that the smart card module 206 can enable pressing to form a smart card module arrangement 200a or a smart card 200b without damage. Conventional smart card modules, which, for example, are not based on the principle of a reinforced (by means of a reinforcement structure) flexible chip arrangement (e.g. flexible chip 206c on flexible substrate 206s), can be damaged or destroyed during pressing, for example.

Furthermore, the smart card module 206 can have a thickness of less than 100 μm, for example, with the result that the smart card module 206 can withstand the pressing.

In accordance with various embodiments, the substrate 206s can be a film, for example a plastics film or a polymer film. Furthermore, the first reinforcement structure 206v can be a metal film, e.g. a copper film or an aluminum film. Furthermore, the second reinforcement structure 306v can be a metal film, e.g. a copper film or an aluminum film.

In accordance with various embodiments, the substrate 206s and/or the smart card module 206 can be flexible, with the result that the method 100a, 110b can be carried out in a roll-to-roll method. A roll-to-roll method can enable a cost-effective, fast and efficient method for producing the smart card module arrangement 200a or the smart card 200b.

Figure 5:
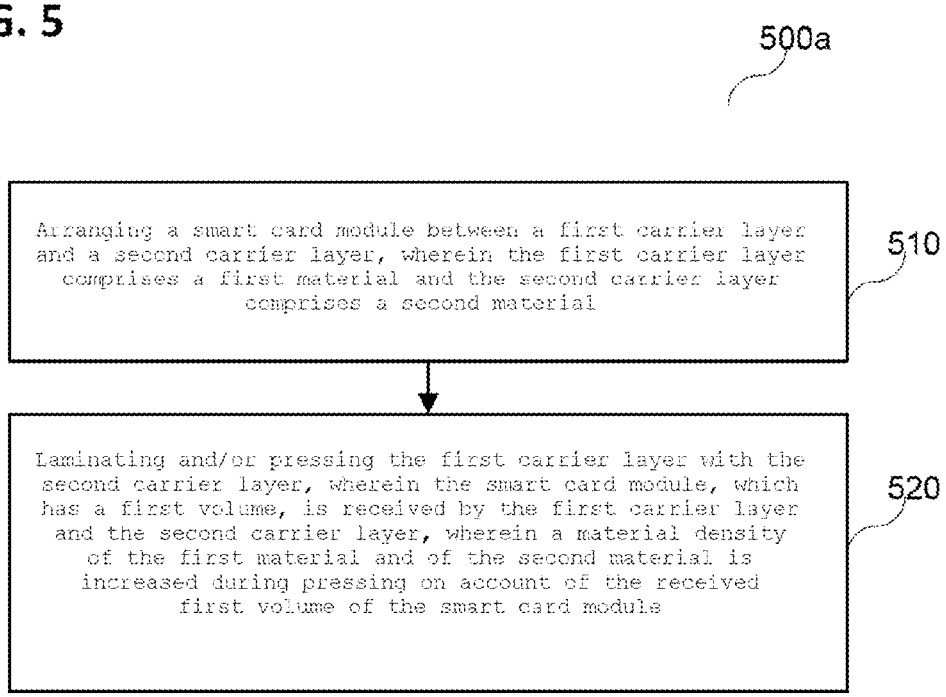
FIG. 5 shows a schematic flow chart for a method for producing a smart card module arrangement, in accordance with various embodiments.

FIG. 5 illustrates, in a schematic flow chart, a method 500a for producing a smart card module arrangement 200a, wherein the method may include: in 510, arranging a smart card module between a first carrier layer and a second carrier layer, wherein the first carrier layer includes a first material and the second carrier layer includes a second material, laminating and/or pressing the first carrier layer with the second carrier layer, wherein the smart card module, which has a first volume, is received by the first carrier layer and the second carrier layer, wherein a material density of the first material and of the second material is increased during pressing on account of the received first volume of the smart card module. Analogously to the method 100b, the method 500a can be part of a method for producing a smart card 200b, as described above.

Accordingly, a smart card module arrangement may include: a carrier layer structure including a carrier material; a smart card module, embedded into the carrier layer structure, wherein the carrier layer structure has a first region below the smart card module and has a second region above the smart card module; and wherein the carrier material of the carrier layer structure is densified in the first region and/or in the second region on account of the embedded smart card module. In this case, the smart card module can include: a substrate; a chip on the substrate; a first mechanical reinforcement structure between the chip and the substrate, wherein the first mechanical reinforcement structure covers at least one part of a surface of the chip.

Figure 6A:
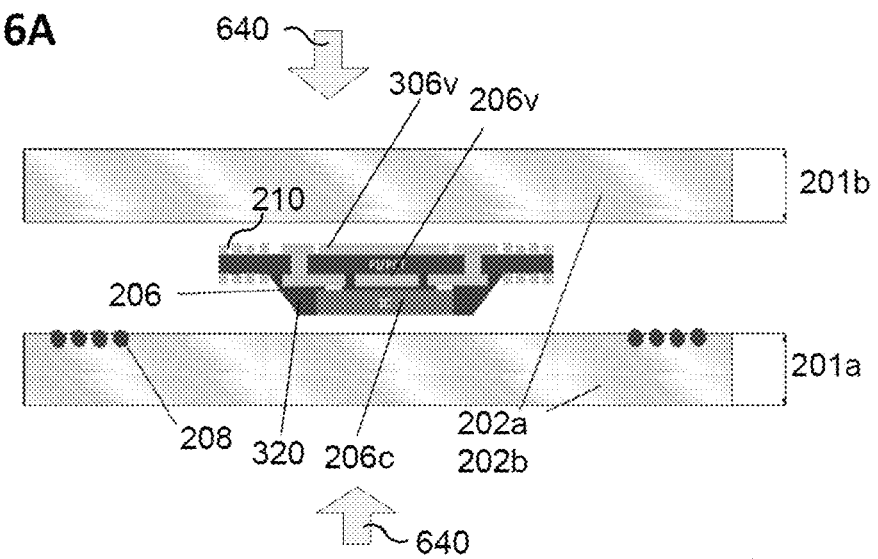
FIGS. 6A to 6C show in each case in a schematic side view or cross-sectional view a smart card module or a smart card for example during production or after production, in accordance with various embodiments.
Figure 6B:
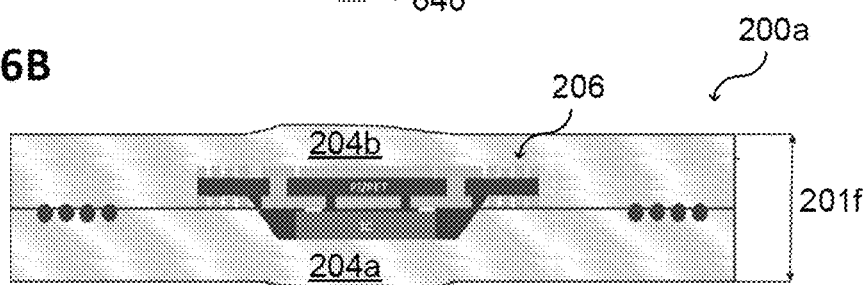
Figure 6C:
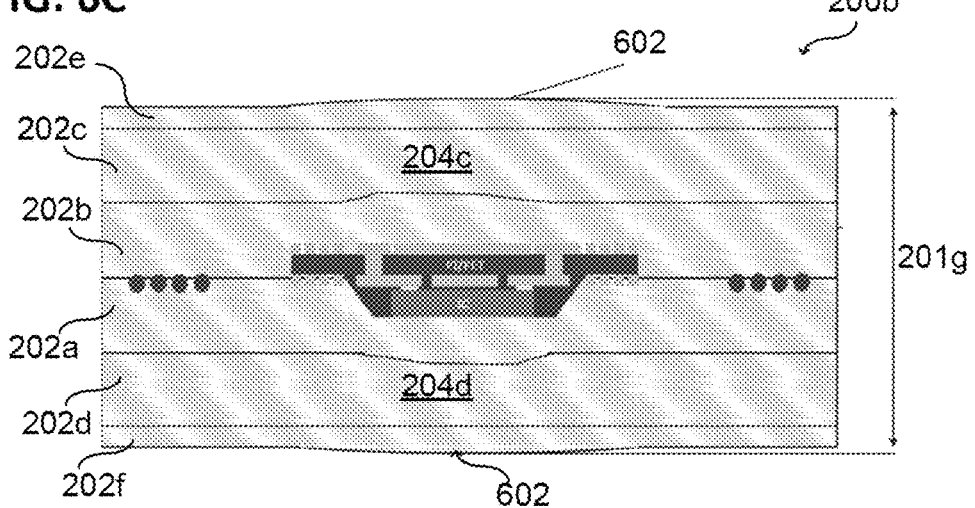

FIG. 6A to FIG. 6C illustrate a smart card module arrangement 200a and/or a smart card 200b in each case in a cross-sectional view, for example during the production process or after the production process.

As is illustrated in FIG. 6A, the smart card module 206 can be arranged between the first carrier layer 202a, which can have the booster antenna 208, and the second carrier layer 202b and subsequently the carrier layers 202a, 202b can be laminated and/or pressed together, or the smart card module 206 can be laminated in and/or pressed in.

In other words, the lamination can be carried out in such a way that a pressure is simultaneously exerted on the carrier layers 202a, 202b, e.g. perpendicularly or transversely with respect to the surface of the carriers (e.g. from the directions 640). The smart card module 206 embedded (laminated) into the carrier layer structure 202a, 202b is illustrated for example in FIG. 6B.

During the pressing and/or lamination, the mechanical pressure can be so great that the density of the carrier material in the regions 204a, 204b (in the vicinity of the smart card module 206) is densified, with the result that volume occupied by the smart card module 206 is partly provided by virtue of the volume of the carrier material being reduced, that is to say the density (mass density, volumetric density, bulk density, true density, pressed density or the like) of the carrier material being increased.

In accordance with various embodiments, the lamination can be hot lamination, wherein, for example, the carrier material of the carrier layers 202a, 202b includes a hot-melt adhesive or a hot-melt adhesive component. In this case, the pressing and/or lamination can be carried out by means of a plurality of hot rolls or rollers or by means of two opposite heating plates which thermally bond the hot-melt adhesive or the hot-melt adhesive component (e.g. at a temperature in a range of approximately 60° C. to 200° C.).

In accordance with various embodiments, the lamination can be cold lamination, which for example can likewise be carried out under pressure by means of rollers or a press.

In accordance with various embodiments, the lamination and pressing of the carrier layers can increase the security against counterfeiting of the smart card module arrangement 200a or of the smart card 200b, since a strong interconnection of the carrier layers with one another and/or of the carrier layers with the smart card module 206 can thus be effected, with the result that subsequent processing of the smart card module arrangement 200a and/or of the smart card cannot be possible without considerable outlay.

In accordance with various embodiments, the total thickness 201f of the smart card module arrangement 200a can be increased locally in the region of the smart card module arrangement 200a, this increase being insignificant compared with the received volume of the smart card module 206.

As is illustrated in FIG. 6C, the smart card module arrangement 200a (and the smart card module 206) can be laminated in between a plurality of further layers 202c, 202d, 202e, 202f (which can have properties similar to those of the carrier layers 202a, 202b, or which can serve as functional layers). In this case, the lamination (and/or pressing) can be carried out in a manner the same as or similar to that already described for the carrier layers 202a, 202b.

In accordance with various embodiments, the total thickness 201g of the smart card 200b can be increased locally in the region of the smart card 200b, this increase 602 being insignificant compared with the received volume of the smart card module 206. As seen illustratively, the surface of the smart card 200b can be designated as planar, wherein the installation position of the smart card module 206 cannot be visible. This can for example likewise increase the security of the smart card 200b against manipulation.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for producing a smart card module arrangement, the method comprising:
   arranging a smart card module on a first carrier layer, wherein the first carrier layer is free of a prefabricated smart card module receptacle cutout for receiving the smart card module, and wherein the smart card module comprises:
      a substrate;
         wherein the substrate comprises a first side and a second side,
         wherein the second side of the substrate is opposite the first side,
      a chip on the substrate;
      a first mechanical reinforcement structure arranged on the first side, between the chip and the substrate, wherein the first mechanical reinforcement structure covers at least one part of a surface of the chip; and
      a second mechanical reinforcement structure arranged on the second side, wherein the second mechanical reinforcement structure covers at least one part of the chip;
   applying a second carrier layer to the smart card module, wherein the second carrier layer is free of a prefabricated smart card module receptacle cutout for receiving the smart card module; and
   at least one of laminating or pressing the first carrier layer with the second carrier layer, such that the smart card module is enclosed by the first carrier layer and the second carrier layer.

2. The method of claim 1,
   wherein the substrate comprises plastic or essentially consists of plastic.

3. The method of claim 1,
   wherein the smart card module further comprises an antenna structure arranged on the substrate.

4. The method of claim 1,
   wherein at least one of the first carrier layer or the second carrier layer comprise/comprises plastic or essentially consist/consists of plastic.

5. The method of claim 1,
   wherein the first carrier layer is at least one of laminated or pressed with the second carrier layer in such a way that the smart card module is enclosed fully circumferentially by the first carrier layer and the second carrier layer in such a way that the smart card module is in physical contact fully circumferentially with the first carrier layer and with the second carrier layer, respectively.

6. The method of claim 1,
   wherein the smart card module arrangement furthermore comprises a booster antenna structure arranged on at least one of the first carrier layer or the second carrier layer.

7. The method of claim 1,
   wherein the first mechanical reinforcement structure comprises a metal, a metallic material, an alloy or an intermetallic compound.

8. The method of claim 1,
   wherein the first mechanical reinforcement structure and the second mechanical reinforcement structure are formed by means of chemical vapor deposition (CVD) or by means of physical vapor deposition (PVD).

9. The method of claim 1,
   wherein the second mechanical reinforcement structure can have an edge structure which can prevent or reduce tearing of the substrate on account of a mechanical loading.

10. A method for producing a smart card, the method comprising:
    producing a smart card module arrangement according to a method, comprising:
    arranging a smart card module on a first carrier layer, wherein the first carrier layer is free of a prefabricated smart card module receptacle cutout for receiving the smart card module, and wherein the smart card module comprises:
       a substrate;
          wherein the substrate comprises a first side and a second side,
          wherein the second side of the substrate is opposite the first side,
       a chip on the substrate;
       a first mechanical reinforcement structure arranged on the first side, between the chip and the substrate, wherein the first mechanical reinforcement structure covers at least one part of a surface of the chip; and
       a second mechanical reinforcement structure arranged on the second side, wherein the second mechanical reinforcement structure covers at least one part of the chip,
       wherein the each mechanical reinforcement structure's surface area is smaller than the substrate's surface area;
    applying a second carrier layer to the smart card module, wherein the second carrier layer is free of a prefabricated smart card module receptacle cutout for receiving the smart card module; and
    at least one of laminating or pressing the first carrier layer with the second carrier layer, such that the smart card module is enclosed by the first carrier layer and the second carrier layer
    wherein the smart card module is embedded between the first carrier layer and the second carrier layer.

11. A smart card module arrangement, comprising:
    a first carrier layer, wherein the first carrier layer is free of a prefabricated smart card module receptacle cutout for receiving the smart card module;
    a smart card module arranged above the first carrier layer, wherein the smart card module comprises:
       a substrate;
          wherein the substrate comprises a first side and a second side, wherein the second side of the substrate is opposite the first side, a chip on the substrate;

a first mechanical reinforcement structure arranged on the first side, between the chip and the substrate, wherein the first mechanical reinforcement structure covers at least one part of a surface of the chip; and a second mechanical reinforcement structure arranged on the second side, wherein the second mechanical reinforcement structure covers at least one part of a surface of the chip;

a second carrier layer arranged above the smart card module, wherein the second carrier layer is free of a prefabricated smart card module receptacle cutout for receiving the smart card module;

wherein the first carrier layer is laminated with the second carrier layer in such a way that the smart card module is enclosed by the first carrier layer and the second carrier layer;

wherein the first mechanical reinforcement layer is adjacent to a first side of the substrate, and wherein the second mechanical reinforcement layer is adjacent to a second side of the substrate.

12. The smart card module of claim 11, wherein the substrate comprises plastic or essentially consists of plastic.

13. The smart card module of claim 11, wherein the smart card module furthermore comprises an antenna structure arranged on the substrate.

14. The smart card module of claim 11, wherein at least one of the first carrier layer or the second carrier layer comprise/comprises plastic or essentially consist/consists of plastic.

15. The smart card module of claim 11, wherein the smart card module is enclosed fully circumferentially by the first carrier layer and the second carrier layer in such a way that the smart card module is in physical contact fully circumferentially with the first carrier layer and with the second carrier layer, respectively.

16. The smart card module of claim 11, wherein the smart card module arrangement furthermore comprises a booster antenna structure arranged on at least one of the first carrier layer or the second carrier layer.

17. The smart card module of claim 11, wherein the first mechanical reinforcement structure comprises a metal, a metallic material, an alloy or an intermetallic compound.

18. The smart card module of claim 11, wherein the first mechanical reinforcement structure and the second mechanical reinforcement structure are formed by means of chemical vapor deposition (CVD) or by means of physical vapor deposition (PVD).

19. The smart card module of claim 11, wherein the second mechanical reinforcement structure can have an edge structure which can prevent or reduce tearing of the substrate on account of a mechanical loading.

20. A smart card, comprising:

a smart card module arrangement, comprising:

a first carrier layer, wherein the first carrier layer is free of a prefabricated smart card module receptacle cutout for receiving the smart card module;

a smart card module arranged above the first carrier layer, wherein the smart card module comprises:

a substrate;

wherein the substrate comprises a first side and a second side, wherein the second side of the substrate is opposite the first side, a chip on the substrate;

a first mechanical reinforcement structure, between the chip and the substrate, wherein the first mechanical reinforcement structure covers at least one part of a surface of the chip; and a second mechanical reinforcement structure arranged on the second side, wherein the second mechanical reinforcement structure covers at least one part of the chip, wherein a lateral extent of each mechanical reinforcement structure area is smaller than a lateral extent of the substrate area;

a second carrier layer arranged above the smart card module, wherein the second carrier layer is free of a prefabricated smart card module receptacle cutout for receiving the smart card module;

wherein the first carrier layer is laminated with the second carrier layer in such a way that the smart card module is enclosed by the first carrier layer and the second carrier layer;

the smart card further comprising:

at least one additional layer on the smart card module arrangement.

* * * * *